United States Patent
Kawaguchi et al.

(10) Patent No.: US 6,476,617 B1
(45) Date of Patent: Nov. 5, 2002

(54) METHOD OF SORTING MONOLITHIC CERAMIC CAPACITORS BY MEASURING THE INSULATION RESISTANCE THEREOF

(75) Inventors: Yoshio Kawaguchi, Fukui (JP); Yoshikazu Takagi, Sabae (JP); Yasunobu Yoneda, Takefu (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

(21) Appl. No.: 09/425,079

(22) Filed: Oct. 21, 1999

(30) Foreign Application Priority Data

Nov. 25, 1998 (JP) .......................................... 10-333621

(51) Int. Cl.[7] .................... G01R 31/12; H01H 31/12; G01N 27/00; H01G 4/06
(52) U.S. Cl. ................ 324/548; 324/551; 324/557; 324/760; 361/311; 361/321.4
(58) Field of Search ............... 324/600, 551, 324/548, 760, 557; 209/574, 573; 361/311, 321.4

(56) References Cited

U.S. PATENT DOCUMENTS

| | | | | |
|---|---|---|---|---|
| 3,872,579 A | * | 3/1975 | Papadopoulos | 29/25.03 |
| 4,379,259 A | * | 4/1983 | Varadi et al. | 714/45 |
| 5,300,824 A | * | 4/1984 | Iyengar | 324/540 |
| 4,465,973 A | * | 8/1984 | Countryman, Jr. | 324/557 |
| 4,467,396 A | * | 8/1984 | Leupold | 361/321.4 |
| 4,583,038 A | * | 4/1986 | Chittick | 324/548 |
| 4,633,175 A | * | 12/1986 | Ritchie et al. | 324/760 |
| 5,117,326 A | * | 5/1992 | Sano et al. | 361/321.4 |
| 5,510,719 A | * | 4/1996 | Yamamoto | 324/548 |
| 5,790,465 A | * | 8/1998 | Roh et al. | 365/201 |
| 5,818,686 A | * | 10/1998 | Mizuno et al. | 361/311 |

FOREIGN PATENT DOCUMENTS

JP 61-96475 5/1986

OTHER PUBLICATIONS

Military Specification, MIL–C–39014R, Dec. 4, 1990; and.
Military Specification, MIL–C–55681C, Jun. 14, 1990.

* cited by examiner

*Primary Examiner*—N. Le
*Assistant Examiner*—Wasseem H. Hamdan
(74) *Attorney, Agent, or Firm*—Ostrolenk, Faber, Gerb & Soffen, LLP

(57) ABSTRACT

A sorting method of monolithic ceramic capacitors in which high reliable sorting can be efficiently achieved based on measuring an insulating resistance involves first performing a burn-in process, which applies not less than double of the rated voltage at the maximum working temperature to a monolithic ceramic capacitor. Thereafter, a high temperature insulation resistance measuring process, which involves measuring an insulation resistance while applying not less than the rated voltage at a temperature of not less than 70° C. to the monolithic ceramic capacitor, is performed so that monolithic ceramic capacitors having abnormal insulation resistances are eliminated. Preferably, the direction of applied voltage in the burn-in process agrees with the direction of applied voltage in the high temperature insulation resistance measuring process.

11 Claims, 2 Drawing Sheets

METHOD OF SORTING MONOLITHIC CERAMIC CAPACITORS BY MEASURING THE INSULATION RESISTANCE THEREOF

BACKGROUND OF THE INVENTION

1. Field of the Invention

The present invention relates to a method for sorting monolithic ceramic capacitors, and more specifically, it relates to an improvement thereof which increases the efficiency of the sorting process and increases the reliability of the sorting results.

2. Description of the Related Art

Monolithic ceramic capacitors may encounter a problem in which defects, such as cavities in a ceramic dielectric substance after burning, are produced when foreign materials are mixed or coagulation substances are produced in a ceramic dielectric substance during manufacturing. Since these defects cause the deterioration of the insulation resistance of a monolithic ceramic capacitor, products having such defects should be sorted out to be eliminated at least before shipping.

In order to sort out defective products for elimination as mentioned above, an insulation resistance of a monolithic ceramic capacitor is generally measured in a manufacturing process of the monolithic ceramic capacitor.

However, the method for judging the presence of a defect by measurement of an insulation resistance as described above is essentially to detect the presence of the defect indirectly. Therefore, when the defect is minute, it is almost impossible to detect it using the indirect method of evaluation of measuring insulation resistance. Thus, in effect, the defect cannot be detected by the evaluation of an insulation resistance. In other words, a capacitor may have a minute defect but still have normal insulation resistance.

However, even a minute defect will cause the insulation resistance of a monolithic ceramic capacitor to deteriorate over time. This is, particularly true of monolithic ceramic capacitors having thin dielectric layers. Therefore, a highly reliable sorting method enabling defects to be detected is required especially as the dielectric layers of the capacitors become thinner.

Recently, there are uses of a monolithic ceramic capacitor requiring long-term reliability, such as military uses, space-technological uses, and automotive uses. In monolithic ceramic capacitors for these uses, high reliability is required in the process for sorting the results of testing. In conjunction with this matter, the following US Military Specification are known as methods for elimination of defective items and confirmation of qualities with a high degree of reliability.

(1) "MIL-C-39014E, Item 4.7.2.2, Thermal Shock and Voltage Conditioning". Double the rated voltage is applied for 96 hours at the maximum working temperature of the capacitor to actualize defects. After that, an insulation resistance is measured at room temperature to detect defects by the degree of deterioration of the insulation resistance. This method is a kind of burn-in.

(2) "MIL-C-55681C, Item 3.9, Insulation Resistance b. at 125° C.". An insulation resistance is measured at 125° C. through the application of the rated voltage to confirm that the resistance is not less than the prescribed value.

However, any of the above-mentioned defect detecting methods according to the US Military Specification present problems.

In the above-mentioned method (1), conditions applied to a capacitor are severe so that a reliable evaluation result can be obtained. However, the method is not efficient as it takes at least 96 hours to obtain the evaluation result. Therefore, when numerous monolithic ceramic capacitors should be evaluated on a 100 percent basis, the method is not practical.

Then, in the above-mentioned method (2), although the evaluation can be completed in a comparatively short time, the reliability of the evaluation result is not satisfactory in comparison with the above-mentioned method (1).

SUMMARY OF THE INVENTION

Accordingly, it is an object of the present invention to provide a sorting method for monolithic ceramic capacitors in which the efficiency is improved and a reliable sorting result is obtained.

To put it simply, the object of the present invention is to solve the above-described technical problems by performing both the methods (1) and (2), which are US Military Specification.

In further detail, a method for sorting of monolithic ceramic capacitors according to the present invention comprises the steps of applying not less than double a rated voltage at a maximum working temperature to a monolithic ceramic capacitor to be sorted as a burn-in process step; and measuring insulation resistances while applying not less than the rated voltage at a temperature of not less than 70° C. to the same monolithic ceramic capacitor as a high temperature insulation resistance measuring process step. As a result, monolithic ceramic capacitors having abnormal insulation resistances can be detected.

In the invention, it may be preferable that the burn-in process be performed in advance while the high temperature insulation resistance measuring process be performed afterward.

In this case, the high temperature insulation resistance measuring process may be performed after the burn-in process without measuring an insulation resistance at room temperature, or the method may further comprise a step of measuring an insulation resistance at room temperature while applying the rated voltage to the monolithic ceramic capacitor after the burn-in process and before the high temperature insulation resistance measuring process.

In the invention, the burn-in process and the high temperature insulation resistance measuring process may be preferably performed as continuous processes.

The direction of applied voltage to the monolithic ceramic capacitor in the burn-in process may preferably agree with the direction of applied voltage to the monolithic ceramic capacitor in the high temperature insulation resistance measuring process.

Other features and advantages of the present invention will become apparent from the following description of the invention which refers to the accompanying drawings.

Figure 1:
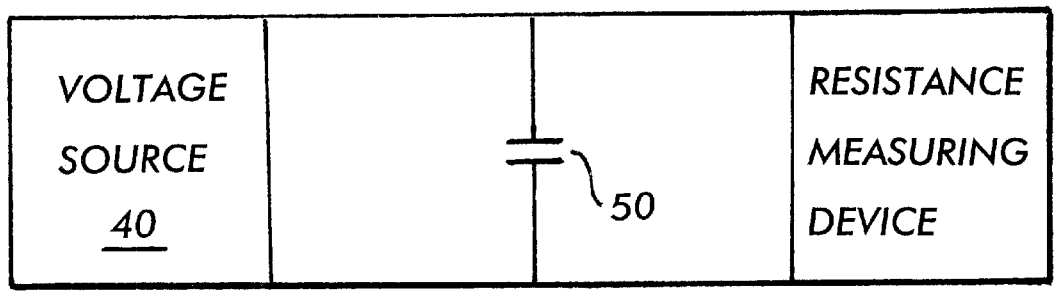
FIG. 1 is a circuit which may be used to measuring the insulation resistance of a monolithic capacitor.

Referring to FIG. 1, a circuit for measuring the insulation resistance of the monolithic ceramic capacitor may include a voltage source 40 for applying the voltage to a monolithic ceramic capacitor 50 to be sorted and a resistance measuring device 60 for measuring the insulation resistance of the capacitor.

Figure 2:
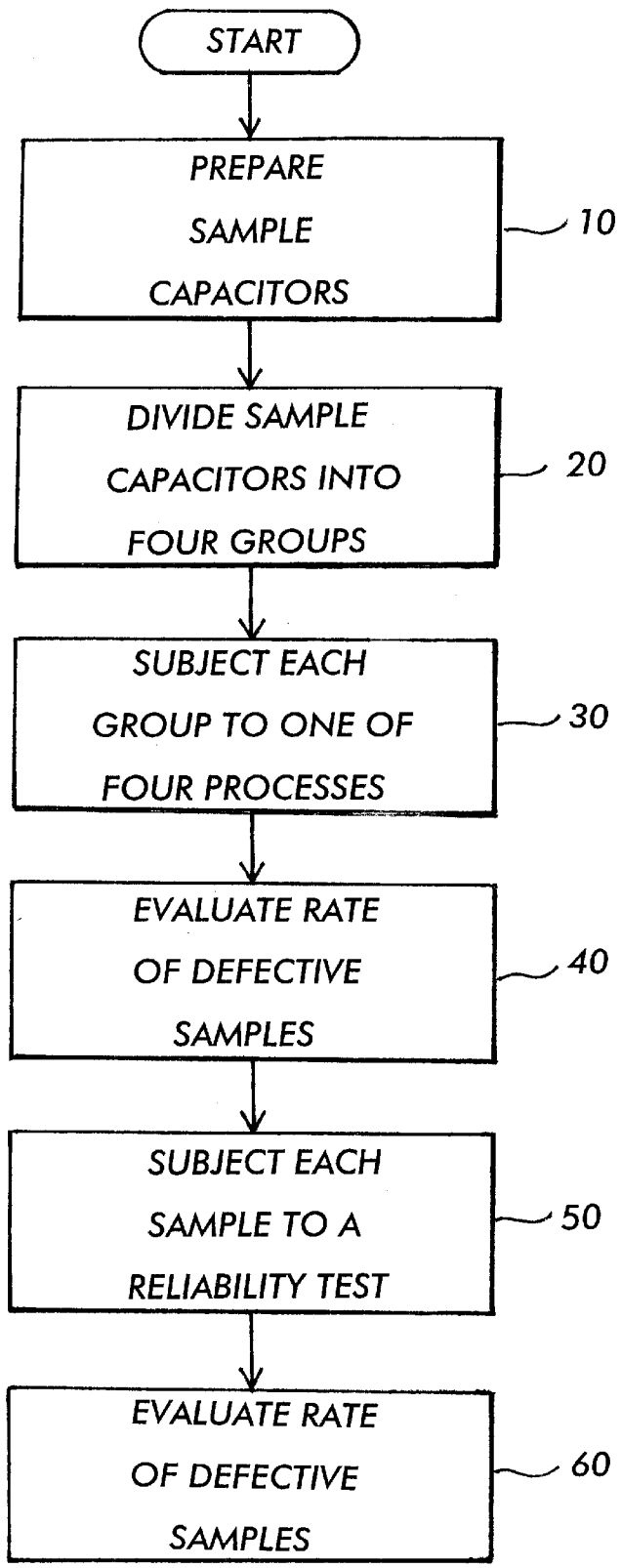
FIG. 2 is a flow chart illustrating the steps of a sorting method illustrating certain features of the invention.

Referring to FIG. 2, a method for sorting of monolithic ceramic capacitors according to the present invention comprises, in step 10, applying not less than double a rated voltage at a maximum working temperature to a monolithic ceramic capacitor to be sorted as a burn-in process step. In step 20, the insulation resistance is measured while applying not less than the rated voltage at a temperature of not less than 70° C. to the same monolithic ceramic capacitor as a high temperature insulation resistance measuring process step. As a result, in step 30, a monolithic ceramic capacitors having an abnormal insulation resistances can be detected.

DETAILED DESCRIPTION OF THE PREFERRED EMBODIMENTS

The present invention will be described with a preferred examples; comparative examples for clarifying the advantages of the present invention will also be described.

Monolithic ceramic capacitors having a size of 3.2 mm×1.6 mm×1.6 mm, a capacitance of 4.7 μF, and a rated voltage of 10 V were prepared as samples. In addition, in order to facilitate comparative evaluation further between the examples of the invention and the comparative examples, the samples were chosen from a lot having numerous cavities in ceramic dielectric portions.

Then, these samples were divided into four groups of 50 samples each. The processes indicated by the Process Nos.1, 2, 3, and 4 in TABLE I were carried out to the first, second, third, and fourth group, respectively.

TABLE 1

| Process No. | 1 | 2 | 3 | 4 |
|---|---|---|---|---|
| Burn-in Process | 105° C. 30 V 5 min | Nothing | 105° C. 30 V 5 min | 105° C. 30 V 5 min |
| Insulation resistance Measuring Process | 25° C. 10 V 1 min | 85° C. 10 V 1 min | 85° C. 10 V 1 min | 85° C. 10 V 1 min |
| Applied Voltage Direction | Disagree | — | Agree | Disagree |
| Defective Rate at Sorting | 3/50 | 1/50 | 5/50 | 3/50 |
| Defective Rate at Reliability Test | 3/47 | 4/49 | 0/45 | 1/47 |

In TABLE I, conditions for each of the burn-in process and the insulation resistance measuring process are shown.

It is apparent from each of conditions of the burn-in process and the insulation resistance measuring process that Process No. 1 is a comparative example of the present invention because although both the burn-in process and the insulation resistance measuring process were performed in Process No. 1, a temperature of only 25° C. (room temperature) was applied in the insulation resistance measuring process.

In Process No. 2, although the insulation resistance measuring process was performed at 85° C., which corresponds to the high temperature insulation resistance measuring process in accordance with the present invention, the burn-in process was not performed, so that this is another comparative example of the invention.

In contrast to processes Nos. 1 and 2, in Process Nos. 3 and 4, both the burn-in process and the insulation resistance measuring process were performed and the temperature was raised to 85° C. in the insulation resistance measuring process as well, which corresponds to the high temperature insulation resistance measuring process in accordance with the present invention, so that these processes are examples of the invention. "Agree" stated in the space of "Applied Voltage Direction" of TABLE I means that the direction of applied voltage to each sample in the burn-in process agrees with the direction of applied voltage to each sample in the insulation resistance measuring process while "Disagree" means that the direction of applied voltage in the burn-in process disagrees with the direction of applied voltage in the insulation resistance measuring process. In addition, "Disagree" means that the directions of applied voltage do not intentionally agree with each other. Therefore, it may be possible that the directions of applied voltage coincide accidentally.

In the processes in which both the burn-in process and the insulation resistance measuring process were performed, as in Process Nos. 1, 3, and 4, after the burn-in process was performed, the insulation resistance measuring process was performed.

After the insulation resistance of each sample was measured in the insulation resistance measuring process in this manner, the sorting was performed based on the results of the measurement. That is, samples having insulation resistances deviating from a normal distribution of resistance values were eliminated. "Defective Rate at Sorting" in TABLE I indicates the rate of samples evaluated as being defective during sorting as described above, i.e., it indicates the rate of eliminated samples. In further detail, among 50 samples each, three samples in Process No. 1, one sample in Process No. 2, five samples in Process No. 3, and three samples in Process No. 4 were eliminated, respectively.

Accordingly, samples left after the elimination in each of Process Nos. 1 to 4 were evaluated as being good.

It may be thought that the more samples that are eliminated in the elimination process, the higher the reliability of the evaluation; however since the samples supplied to each of Process Nos. 1 to 4 are different from one another, the number of eliminated samples is not necessarily reflective of the reliability of the evaluation.

In order to evaluate the reliability of the decision, a long-term reliability test in which the voltage of 20 V was further applied to each sample for 2000 hours at 125° C. was performed. Then, the insulation resistances after that were measured applying the rated voltage of 10 V at room temperature, so that samples having insulation resistances deviating from a distribution of resistance values of normal products were evaluated as being defective. "Defective Rate at Reliability Test" in TABLE I indicates the rate of samples evaluated as being defective in this reliability test.

As understood from the results of "Defective Rate at Reliability Test", high reliability can be confirmed in the sorting in Process Nos. 3 and 4, which corresponds to the example of the present invention.

In particular, according to Process No. 3 in which the directions of applied voltage in the burn-in process and the insulation resistance measuring process agree with each other, there was no defective sample even when the above-mentioned long-term reliability test with severe conditions was performed, so that the extremely high reliability of the sorting can be assured. In contrast, according to Process No. 4 in which the directions of applied voltage in the burn-in process and the insulation resistance measuring process did not agree with each other, one defective sample was found in the long-term reliability test. This confirms that there may be cases in which defective samples cannot be precisely sorted out when the directions of applied voltage disagree.

The present invention has been described as above with reference to the above-described examples; other various modified examples may be possible within the scope of the invention.

For example, the insulation resistance measuring process is performed between the burn-in process and the insulation resistance measuring process without measuring an insulation resistance in the above-described examples; a process for measuring an insulation resistance may be further performed applying the rated voltage to a monolithic ceramic capacitor after the burn-in process and before the insulation resistance measuring process.

In the burn-in process and the insulation resistance measuring process in the above-described examples, the latter was performed after the former;

conversely, the former may be performed after the latter. In addition, an insulation resistance measuring process for eliminating defective samples may be added in the latter case.

In the above-described examples, the burn-in process and the insulation resistance measuring process were performed as continuous processes; however, these processes may be performed as interrupted processes, for example, as time-sharing independent processes, as long as both the burn-in process and the insulation resistance measuring process are performed.

The temperature and voltage applied in the burn-in process, the temperature and voltage applied in the high temperature insulation resistance measuring process, and the times for the burn-in process and the high temperature insulation resistance measuring process may be changed in accordance with the kinds of monolithic ceramic capacitors to be sorted, the required degree of the reliability in sorting, or so forth.

As described above, since both the burn-in process and the high temperature insulation resistance measuring process are performed for sorting to eliminate monolithic ceramic capacitors having abnormal insulation resistances in accordance with the present invention, even when the burn-in process is completed within a short time, such as one to ten minutes, latent defects in monolithic ceramic capacitors can be actualized, so that sorting results with high reliability can be obtained in a short time.

Therefore, this enables numerous monolithic ceramic capacitors to be sorted out effectively.

In the invention, when the burn-in process is performed in advance while the high temperature insulation resistance measuring process is performed afterward, a process for measuring insulation resistances can be completed by only the high temperature insulation resistance measuring process, so that the sorting can be further effectively performed.

In addition, when an insulation resistance measuring process is performed applying the rated voltage to monolithic ceramic capacitors after the burn-in process and before the high temperature insulation resistance measuring process, the sorting reliability can be further improved.

In the invention, when the burn-in process and the high temperature insulation resistance measuring process are performed as continuous processes, this contributes not only to further effective sorting but also to reduced thermal energy because at least part of the thermal energy applied in the preceding process can be brought to the process afterward.

When the direction of applied voltage to the monolithic ceramic capacitor in the burn-in process agrees with the direction of applied voltage to the monolithic ceramic capacitor in the high temperature insulation resistance measuring process, sorting results with higher reliability can be obtained.

In addition, when the burn-in process and the high temperature insulation resistance measuring process are performed as continuous processes, as described above, assumed orientation of monolithic ceramic capacitors in the preceding process can be brought into the process afterward without disordering, so that the direction of applied voltage in each process can be easily agreed with each other.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for sorting of monolithic ceramic capacitors having a rated insulation resistance and a rated operating voltage, comprising the steps of:

applying not less than double the rated operating voltage at a maximum working temperature to a monolithic ceramic capacitor to be sorted as a burn-in process step; and measuring an insulation resistance across the capacitor while applying not less than the rated voltage at a temperature of not less than 70° C. to the monolithic ceramic capacitor as a high temperature insulation resistance measuring process step, comparing the measured insulation resistance to the rated resistance corresponding to the capacitor whereby a monolithic ceramic capacitor having an abnormal insulation resistance may be detected.

2. A method according to claim 1, wherein the burn-in process is not performed before the high temperature insulation resistance measuring process.

3. A method according to claim 2, wherein the high temperature insulation resistance measuring process is performed after the burn-in process without measuring an insulation resistance at room temperature.

4. A method according to claim 2, further comprising the step of measuring an insulation resistance at room temperature while applying the rated voltage to the monolithic ceramic capacitor after the burn-in process and before the high temperature insulation resistance measuring process.

5. A method according to any one of claims 1 to 4, wherein the burn-in process and the high temperature insulation resistance measuring process are performed as continuous processes.

6. A method for sorting of monolithic ceramic capacitors having a rated insulation resistance and a rated operating voltage, comprising the steps of:

applying not less than double the rated operating voltage at a maximum working temperature to a monolithic ceramic capacitor to be sorted as a burn-in process step; and measuring an insulation resistance across the capacitor while applying not less than the rated voltage at a temperature of not less than 70° C. to the monolithic ceramic capacitor as a high temperature insulation resistance measuring process step, comparing the measured insulation resistance to the rated resistance corresponding to the capacitor whereby a monolithic ceramic capacitor having an abnormal insulation resistance may be detected, and wherein the burn-in process and the high temperature insulation resistance measuring process are performed as continuous processes and wherein the direction of applied voltage to the monolithic ceramic capacitor in the burn-in process agrees with the direction of applied voltage to the monolithic ceramic capacitor in the high temperature insulation resistance measuring process.

7. A method for sorting of monolithic ceramic capacitors having a rated insulation resistance and a rated operating voltage, comprising the steps of:

applying not less than double the rated operating voltage at a maximum working temperature to a monolithic ceramic capacitor to be sorted as a burn-in process step; and measuring an insulation resistance across the capacitor while applying not less than the rated voltage at a temperature of not less than 70° C. to the monolithic ceramic capacitor as a high temperature insulation resistance measuring process step, comparing the measured insulation resistance to the rated resistance corresponding to the capacitor whereby a monolithic ceramic capacitor having an abnormal insulation resistance may be detected, and wherein the burn-in process is not performed before the high temperature insulation resistance measuring process and the burn-in process and the high temperature insulation resistance measuring process are performed as continuous processes, and the direction of applied voltage to the monolithic ceramic capacitor in the burn-in process agrees with the direction of applied voltage to the monolithic ceramic capacitor in the high temperature insulation resistance measuring process.

8. A method for sorting of monolithic ceramic capacitors having a rated insulation resistance and a rated operating voltage, comprising the steps of:

applying not less than double the rated operating voltage at a maximum working temperature to a monolithic ceramic capacitor to be sorted as a burn-in process step; and measuring an insulation resistance across the capacitor while applying not less than the rated voltage at a temperature of not less than 70° C. to the monolithic ceramic capacitor as a high temperature insulation resistance measuring process step, comparing the measured insulation resistance to the rated resistance corresponding to the capacitor whereby a monolithic ceramic capacitor having an abnormal insulation resistance may be detected, and wherein the high temperature insulation resistance measuring process is performed after the burn-in process without measuring an insulation resistance at room temperature, the burn-in process and the high temperature insulation resistance measuring process are performed as continuous processes, and the direction of applied voltage to the monolithic ceramic capacitor in the burn-in process agrees with the direction of applied voltage to the monolithic ceramic capacitor in the high temperature insulation resistance measuring process.

9. A method for sorting of monolithic ceramic capacitors having a rated insulation resistance and a rated operating voltage, comprising the steps of:

applying not less than double the rated operating voltage at a maximum working temperature to a monolithic ceramic capacitor to be sorted as a burn-in process step;

measuring an insulation resistance across the capacitor while applying not less than the rated voltage at a temperature of not less than 70° C. to the monolithic ceramic capacitor as a high temperature insulation resistance measuring process step, comparing the measured insulation resistance to the rated resistance corresponding to the capacitor whereby a monolithic ceramic capacitor having an abnormal insulation resistance may be detected;

measuring an insulation resistance at room temperature while applying the rated voltage to the monolithic ceramic capacitor after the burn-in process and before the high temperature insulation resistance measuring process, wherein the burn-in process and the high temperature insulation resistance measuring process are performed as continuous processes; and the direction of applied voltage to the monolithic ceramic capacitor in the burn-in process agrees with the direction of applied voltage to the monolithic ceramic capacitor in the high temperature insulation resistance measuring process.

10. A method for sorting of monolithic ceramic capacitors having a rated insulation resistance and a rated operating voltage, comprising the steps of:

applying not less than double the rated operating voltage at a maximum working temperature to a monolithic ceramic capacitor to be sorted as a burn-in process step; and measuring an insulation resistance across the capacitor while applying not less than the rated voltage at a temperature of not less than 70° C. to the monolithic ceramic capacitor as a high temperature insulation resistance measuring process step, comparing the measured insulation resistance to the rated resistance corresponding to the capacitor whereby a monolithic ceramic capacitor having an abnormal insulation resistance may be detected, and wherein the direction of applied voltage to the monolithic ceramic capacitor in the burn-in process agrees with the direction of the applied voltage to the monolithic ceramic capacitor in the high temperature insulation resistance measuring process.

11. A method for sorting of monolithic ceramic capacitors having a rated insulation resistance and a rated operating voltage, comprising the steps of:

applying not less than double the rated operating voltage at a maximum working temperature to a monolithic ceramic capacitor to be sorted as a burn-in process step; and measuring an insulation resistance across the capacitor while applying not less than the rated voltage at a temperature of not less than 70° C. to the monolithic ceramic capacitor as a high temperature insulation resistance measuring process step, comparing the measured insulation resistance to the rated resistance corresponding to the capacitor whereby a monolithic ceramic capacitor having an abnormal insulation resistance may be detected;

wherein the burn-in process and the high temperature insulation resistance measuring process are performed as continuous processes in one apparatus.

* * * * *